(12) United States Patent
Urard et al.

(10) Patent No.: US 7,454,693 B2
(45) Date of Patent: Nov. 18, 2008

(54) LDPC DECODER

(75) Inventors: Pascal Urard, Theys (FR); Laurent Paumier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 528 days.

(21) Appl. No.: 11/158,718

(22) Filed: Jun. 22, 2005

(65) Prior Publication Data

US 2005/0281111 A1    Dec. 22, 2005

(30) Foreign Application Priority Data

Jun. 22, 2004    (FR) .................... 04 51308

(51) Int. Cl.
*G06F 11/00*    (2006.01)
(52) U.S. Cl. .................................... 714/800
(58) Field of Classification Search ............... 714/799, 714/800, 807
See application file for complete search history.

(56) References Cited

U.S. PATENT DOCUMENTS

| | | |
|---|---|---|
| 2004/0034828 A1 | 2/2004 | Hocevar |
| 2005/0262420 A1* | 11/2005 | Park et al. .................... 714/758 |

OTHER PUBLICATIONS

Kienle et al, A synthesizable IP COre for DVB-S2 LDPC COde Decoding, 2005, IEEE Proceedings of the Design, Automation and Test in Europe Conf. & Exhibition, p. 1-6.*
Babvey et al. AN efficient R-Mesh Implementation of LDPC Codes Message-passind Decoder, Apr. 2005, Proceddings of the 19th IEEE internation Parallel and Distributed Processing Symposium, p. 1-8.*
Kienle et al., Efficinet hardware realization of IRA code decoders, 2004, IEEE, p. 286-291.*

French Search Report from French Patent Application No. 04/51308, filed Jun. 22, 2004.
Karkooti M. et al. "Semi-parallel reconfigurable architectures for real-time LDPC decoding" Proc., IEEE Conference on Information Technoloyg Computing, ITCC '04, vol. 1, Apr. 5, 2004, pp. 579-582.
Tong Zhang et al. "A54 MBPS (3,6)—Regular FPGA decoder" Proc., IEEE Workshop on Signal Processing Systems, San Diego, CA, Oct. 16, 2002, pp. 127-132, XP010616589.
Selvarathinam A., et al. "A massively scaleable decoder architecture for low-density parity-check codes" Proc., IEEE International Symposium on Circuits and Systems, ISCAS 2003, Bangkok, Thailand, vol. 2 of 5, May 25, 2003, pp. 61-64, XP002260921 ISBN: 0-7803-7761-3.
Gunnam K. et al. "An LDPC decoding schedule for memory access reduction" Proc., IEEE International Conference on Acoustics, Speech, and Signal Processing, vol. 5, May 17, 2004, pp. 173-176, XP002302865.

(Continued)

*Primary Examiner*—Shelly A Chase
(74) *Attorney, Agent, or Firm*—Lisa K. Jorgenson; James H. Morris; Wolf, Greenfield & Sacks, P.C.

(57) ABSTRACT

An LDPC decoder having a determined number of processing units operating in parallel, storage circuitry capable of containing first words containing a juxtaposition of messages of a first type, and second words containing a juxtaposition of messages of a second type, a message provision unit capable of providing each processing unit with a message of the first type or a message of the second type, and a message write unit capable of writing, into the storage circuitry, first words or second words. The message provision unit is capable of providing a message at a position in a word which depends on the word or the message write unit is capable of writing each message at a position in the word which depends on the word.

20 Claims, 5 Drawing Sheets

OTHER PUBLICATIONS

Mansour M. M. et al. "High-throughput LDPC decoders" IEEE Transactions on Very Large Scale Integration (VLSI) Systems, vol. 11, No. 6, Dec. 6, 2003, pp. 976-996, XP002302866 ISSN: 1063-8210.

Cocco M. et al. "A scalable architecture for LDPC decoding" Proc., IEEE Design, Automation and Test in Europe Conf. and Exhibition Designers Forum, Date '04, vol. 3, Feb. 16, 2004, pp. 88-93, XP010685018.

Blanksby A.J. et al. "A 690-mW 1-Gb/s 1024-b, rate-1/2 low-density parity-check code decoder" IEEE Journal of Solid-State Circuits IEEE USA, vol. 37, No. 3, Mar. 2002, pp. 404-412, XP002302867 ISSN: 0018-9200.

Mansour M.M. et al. "Architecture-aware low-density parity-check codes" Proc., IEEE International Symposium on Circuits and Systems, Bangkok, Thailand, vol. 2, May 25, 2003, pp. II 57-II 60, XP002302868 ISBN: 0-7803-7761-3.

* cited by examiner

LDPC DECODER

BACKGROUND OF THE INVENTION

1. Field on the Invention

The present invention relates to an LDPC (Low Density Parity Check) decoder.

2. Discussion of the Related Art

LDPC decoding enables obtaining performance very close to the Shannon limit. LDPC decoders generally have better performance than turbo-code decoders and are currently used in broadcasting systems, for example, satellite digital television broadcasting systems.

LDPC decoding consists, for a given word s containing k bits, of transmitting a word u containing n bits, among which n-k additional bits called parity bits which fulfill n-k parity equations. The matrix H having n-k lines and n columns verifying the following relation is called the code control matrix:

$$H*^{t}u=0 \tag{1}$$

The size of the matrices H generally used is significant since they may comprise more than 60,000 columns and 50,000 lines. Further, such matrices are practically empty and may comprise one "1" for approximately 10,000 "0"s. This is why they are called low-density matrices.

The number of "1"s in the line is called the check node degree of a line and the number of "1"s in the column is called the bit node degree. There are two types of LDPC codes: regular codes and irregular codes. Matrix H of a regular code has a constant number of "1"s per line and per column. The check node and bit node degrees are then constant. An irregular code has no constant check node degrees and/or bit node degrees and has a more random character. However, the best performances are obtained for irregular codes. The problem of an irregular matrix is that it is random. The decoding can then be difficult. European digital satellite television standard DVB-S2 advocates for the use of a matrix H which has a constant check node degree, between 4 and 30, and a bit node degree that can take three values, between 2 and 13.

FIG. 1 shows a graph corresponding to an equivalent representation of a matrix H of an LDPC code. Each circle 10 represents a bit node. As an example, six bit nodes BNi, With i ranging from 0 to 5, are shown. Each square 12 represents a check node. As an example, four check nodes CNj, with j ranging from 0 to 3, are shown. Branches 14 connect given bit nodes BNi to given check nodes CNj. The presence of a branch 14 between a bit node of index i and a check node of index j means that the equivalent matrix H has a "1" at line j and at column i. Note Ne the total number of branches 14 in the graph. Number Ne thus corresponds to the number of "1"s of matrix H.

The matrix H equivalent to the graph shown in FIG. 1 is the following:

$$H = \begin{pmatrix} 1 & 1 & 0 & 0 & 1 & 0 \\ 1 & 0 & 1 & 0 & 0 & 1 \\ 0 & 1 & 0 & 1 & 1 & 0 \\ 0 & 0 & 1 & 1 & 0 & 1 \end{pmatrix} \tag{2}$$

Such a matrix H has a constant bit node degree equal to 2 and a constant check node degree equal to 3.

LDPC decoding uses log-likelihood ratios (LLR). For a transmitted information bit d to which corresponds a signal y received by the decoder after addition of the transmit channel noise, the LLR ratio of bit d with respect to signal y is defined as follows:

$$LLR(y) = LLR(d \mid y) = \ln \frac{P(d=0 \mid y)}{P(d=1 \mid y)} \tag{3}$$

where P(d=0|y) is the probability for transmitted bit d to be equal to 0 according to the received value y and P(d=1|y) is the probability for transmitted bit d to be equal to 1 according to the received value y. Such probabilities especially depend on the features of the transmit channel. The larger LLR(y), the greater the probability for transmitted bit d to be equal to "0". As an example, it may be decided, for a received signal y, that if LLR(y) is negative, then transmitted bit d is a "1" and that, otherwise, transmitted bit d is a "0".

LDPC decoding is based on a so-called message passing algorithm. Such an algorithm consists of associating with each bit node a received signal to which corresponds an initial LLR ratio, and of iteratively exchanging messages between bit nodes 10 and check nodes 12, along branches 14 of the graph corresponding to matrix H. The exchanged messages are log likelihood ratios and enable determining, after several iterations, for each received signal a corrected LLR ratio based on which the bit which has been transmitted is finally determined.

An iteration of such an algorithm mainly comprises two steps:

a "bit node determination" step which consists, for each bit node, of gathering the messages transmitted to the bit node by the check nodes to which the bit node is connected and of sending a new message to each check node to which the bit node is connected; and a "check node determination" step which is the symmetrical operation and which consists, for each check node, of gathering the messages transmitted to the check node by the bit nodes to which the check node is connected and of sending a new message to each bit node to which the check node is connected.

It can actually be considered that each branch 14 corresponds to a memory element from which a message is read before each bit or check node determination step and into which a message is written after each bit or check node determination step.

The LDPC decoding algorithm will now be more specifically described for a graph having dbn bit nodes BNi, i ranging from 0 to dbn-1, and dcn check nodes CNj, j ranging from 0 to dcn-1. For the first iteration, the bit node determination step is carried out by using, for each bit node BNi, value $LLR(y_i)$ where $y_i$ is the received signal associated with bit node BNi. Values $LLR(y_i)$ are obtained from the characteristics of the transmit channel. Message $v_{i \to j}$, called a bit node message, transmitted by bit node BNi to check node CNj, is initialized as follows:

$$v_{i \to j} = LLR(y_i) \tag{4}$$

The next check node determination step consists, for each check node $CN_j$, of transmitting a message $w_{j \to i}$, called a check node message, to each bit node BNi connected to parity node CNj. Each message $w_{j \to i}$ is determined from the check equation associated with check node CNj. For this purpose, the bit node messages provided by the bit nodes BNk connected to check node CNj are simply used, except for bit node BNi to which message $w_{j \to i}$ is transmitted, and message $w_{j \to i}$ is obtained by verifying the parity equation. Let $S1j$ be the subset of $[0,dbn-1]$ containing the indexes k such that bit nodes BNk are connected to check node CNj. The expression of $w_{j \to i}$ is given by the following relation:

$$w_{j \to i} = \ln \left( \frac{1 + \prod_{k \in S1j, k \neq i} \tanh(v_{k \to j}/2)}{1 - \prod_{k \in S1j, k \neq i} \tanh(v_{k \to j}/2)} \right) \quad (5)$$

For the next iterations, the bit node determination step is carried out, for each bit node BNi, based on the check node messages provided by check nodes CNj connected to bit node BNi. For each check node CNj connected to bit node BNi, a message $v_{i \to j}$ corresponding to the sum of initial value LLR ($y_i$) and of all the messages received from the check nodes connected to bit node BNi, except for the message transmitted by node CNj is provided. Let $S2i$ be the subset of $[0,dcn-1]$ containing indexes k such that check nodes CNk are connected to bit node BNi. The expression of $v_{i \to j}$ thus is the following:

$$v_{i \to j} = LLR(y_i) + \sum_{k \in S2i, k \neq j} w_{k \to i} \quad (6)$$

Once a determined number of iterations has been performed, a value Li corresponding to a corrected LLR ratio is determined for each bit node BNi. Li is determined by the following equation:

$$L_i = LLR(y_i) + \sum_{k \in S2i} w_{k \to i} \quad (7)$$

It is then decided, for each bit node BNi, based on value $L_i$, which is the value of the bit associated with the received signal $y_i$. For example, if Li is negative or zero, it may be decided that the bit is equal to 1 and if Li is strictly positive, it may be decided that the bit is equal to 0.

FIG. 2 schematically shows an example of the forming of an LDPC decoder 20 implementing the previously-described algorithm.

Decoder 20 comprises a processing unit 22 comprising NB separate elementary processing units 24 ($Mod_j$, j ranging from 1 to NB) capable of performing in parallel calculation operations to provide the bit and check node messages.

Decoder 20 comprises a RAM 26 in which are stored the bit node messages provided by units 24 after a bit node determination step and check node messages provided by units 24 after a check node determination step. Memory 26 comprises Ne/NB lines. At each line of memory 26 is stored a word containing a number of bits equal to the product of number NB of units 24 by the number of bits that can be processed by a unit 24. Each word corresponds to the juxtaposition of NB bit node messages or of NB check node messages.

Decoder 20 comprises an input memory 28 in which are stored initial values LLR($y_i$), i ranging from 0 to dbn-1. Decoder 20 also comprises an output memory 30 in which are stored values Li, i ranging from 0 to dbn-1.

Processing unit 22 is connected to a multiplexer 32, controlled by a control signal S1 which, according to the value of control signal S1, provides processing unit 22 with a word from input memory 28, a word directly read from memory 26, or a word provided by a rearrangement unit 34 and which corresponds to a word of memory 26 in which the order of the messages forming the word has been modified. More specifically, when a word is transmitted to processing unit 22, the message at the first position in the word is transmitted to the first elementary processing unit $Mod_1$, etc., and the message at the $NB^{th}$ position in the word is transmitted to the $NB^{th}$ elementary processing unit $Mod_{NB}$.

Processing unit 22 is capable of successively providing words corresponding to the juxtaposition of NB bit node messages or of NB check node messages. More specifically, when a word is transmitted to processing unit 22, the message at the first position in the word is provided by first elementary processing unit $Mod_1$, etc., and the message at the $NB^{th}$ position in the word is provided by the $NB^{th}$ elementary processing unit $Mod_{NB}$. The words provided by processing unit 22 may be transmitted to output memory 30 or to a rearrangement unit 38 capable of providing a new word from a received word and corresponding to the received word in which the order of the NB bit node messages or of the NB check node messages is modified.

Rearrangement unit 38 drives a first input of a multiplexer 39, controlled by a signal S3. Processing unit 22 drives a second input of multiplexer 39. According to the value of S3, multiplexer 39 provides memory 26 with the word provided by rearrangement unit 38 or by processing unit 22.

Decoder 20 comprises an address provision unit 40, for example, comprising a ROM. At each line of address provision unit 40 are stored an address in memory 26 and rearrangement data. Rearrangement units 34 or 38 are capable of modifying the order of the messages in a word based on rearrangement data. The rearrangement data may correspond to a number of shift positions. By successively reading the lines of address provision unit 40, a series of addresses of memory 26 is obtained in an order different from the regular order of the reading from the lines of memory 26.

Upon operation of decoder 20, for a bit node determination step or for a check node determination step, an elementary unit 24 is brought to use bit or check node messages which are located at different locations in memory 26.

Generally, the messages are distributed in memory 26 so that, in a check node determination step, the words can be read successively according to the regular order of access to memory 26, the bit node message placed at the first position of each word of memory 26 being used by first elementary unit $MOD_1$, etc., and the bit node message placed at the $NB^{th}$ position being used by the $NB^{th}$ elementary unit $MOD_{NB}$. After a check node determination step, each check node message is stored at the same position as the bit node message previously associated with the same branch.

In the next bit node determination step, rearrangement unit 34 reads the words from memory 26 according to the read order provided by address provision unit 40. For each read word, rearrangement unit 34 provides a new word corresponding to the read word in which the message order is modified based on the rearrangement data of address provision unit 40. The messages are, for example, shifted to the left by a number of positions equal to the number of shift positions stored in address provision unit 40 for the read address. The message at the first position in the new word is then provided to first elementary unit $Mod_1$, etc. and the message at the $NB^{th}$ position in the new word is provided to the $NB^{th}$ elementary processing unit $Mod_{NB}$.

From a word transmitted by processing unit 22, rearrangement unit 38 provides a new word that it stores in memory 26 according to an order provided by address provision unit 40 so that each bit node message is stored at the same location as the previous check node message associated with the same branch. For example, each new word corresponds to the received word in which the bit node messages are shifted to the right by a number of shift positions stored in address provision unit 40.

Memory 26 is generally a large size memory since Ne may be greater than 200,000. It generally is a dual port random access memory (DPRAM) which especially enables simultaneous reading of a first word and writing of a second word stored at different lines in the memory. Indeed, in a bit node determination step or in a check node determination step, the readings from memory 26 of words transmitted to processing unit 22 are performed simultaneously with the writings into memory 26 of words provided by processing unit 22. This enables reducing to a minimum the duration of an iteration of the decoding algorithm.

However, dual access memories have disadvantages. The duration of a read or write operation may be a limiting factor for the total duration of an iteration of the decoding algorithm. Further, the average power consumed by such a memory amounts to a non-negligible part of the decoder power consumption.

SUMMARY OF THE INVENTION

The present invention aims at obtaining an LDPC decoder having improved characteristics of rapidity of completion of an iteration of the decoding algorithm.

The present invention also aims at obtaining an LDPC decoder having improved power consumption characteristics.

To achieve these and other objects, the present invention provides an LDPC decoder comprising a determined number of processing units operating in parallel, capable of receiving first messages and of providing second messages based on a processing of the first received messages; first and second single-port memories; and means capable of reading first words both from the first single-port memory and from the second single-port memory, each first word containing a juxtaposition of first messages in a number equal to said determined number; providing first messages to the processing units based on the first read words; forming second words, each second word containing a juxtaposition of second messages provided by the processing units in a number equal to said determined number; and writing the second words into the first and second single-port memories, said means being capable, for at least a first word and a second word, of reading the first word from the first single-port memory and of simultaneously writing the second word into the second single-port memory or of reading the first word from the second single-port memory and of simultaneously writing the second word into the first single-port memory.

According to an embodiment of the present invention, the processing units are capable of receiving second messages and of providing new first messages based on a processing of the second messages, the processing of the second messages being different from the processing of the first messages, said decoder further comprising means capable of reading second words both from the first single-port memory and from the second single-port memory; providing second messages to the processing units from the second read words; forming new first words from the new first messages provided by the processing units; and writing the new first words into the first and second single-port memories, said means being capable, for at least a second word and a new first word, of reading the second word from the first single-port memory and simultaneously writing the new first word into the second single-port memory or of reading the second word from the second single-port memory and simultaneously writing the new first word into the first single-port memory.

According to an embodiment of the present invention, the decoder comprises a first rearrangement unit capable of providing each processing unit, for each first read word, with a first message at a position in the first word which depends on the first read word and on the processing unit; and a second rearrangement unit for forming the second words, the position of a second message in the second word depending on the second word and on the processing unit having provided the second message.

According to an embodiment of the present invention, the decoder comprises a rearrangement unit capable of providing each processing unit, for each first read word, with a first message at a position in the first word which depends on the first read word and on the processing unit, and capable of providing each processing unit, for each second read word, with a second message at a position in the second read word which depends on the second read word and on the processing unit.

According to an embodiment of the present invention, the decoder comprises a rearrangement unit capable forming the second words, the position of a second message in a second word depending on the second word and on the processing unit having provided the second message, and capable of forming the new first words, the position of a new first message in a new first word depending on the new first word and on the processing unit having provided the new first message.

The present invention also provides an iterative LDPC decoding method, comprising a determined number of processing units operating in parallel, said method comprising the reading of first words both from a first single-port memory and from a second single-port memory, each first word containing a juxtaposition of first messages in a number equal to the determined number; the provision to each processing unit, for each first read word, of a first message of the first word; the provision, by each processing unit, of second messages based on a processing of the first messages; and the writing of the second words into the first and second single-port memories, each second word corresponding to a juxtaposition of second messages in a number equal to the determined number, for at least a first word and a second word, the reading of the first word from the first memory being performed simultaneously with the writing of the second word into the second memory or the reading of the first word from the second memory being performed simultaneously with the writing of the second word into the first memory.

According to an embodiment of the present invention, the method further comprises the steps of reading the second words both from the first single-port memory and from the second single-port memory; providing each processing unit, for each second read word, with a second message of the second word; having each processing unit provide new first messages based on a processing of the second messages, the processing of the second messages being different from the processing of the first messages; and writing into the first and second memories new first words obtained from the new first messages, for at least a second word and a new first word, the reading of the second word from the first memory being performed simultaneously with the writing of the new first word into the second memory or the reading of the second word from the second memory being performed simultaneously to the writing of the new first word into the first memory.

According to an embodiment of the present invention, the order of the reading of the first words from the first and second single-port memories is different from the order of the reading of the second words from the first and second single-port memories.

According to an embodiment of the present invention, at the step of providing each processing unit, for each first read word, with a first message of the first read word, the first message is at a position in the first read word which depends on the first read word and on the processing unit, and at the step of writing the second words into the first and second single-port memories, each second word contains a second message at a position in the second word which depends on the second word and on the processing unit having provided the second message.

According to an embodiment of the present invention, at the step of providing each processing unit, for each first read word, with a first message of the first read word, the first message is at a position in the first read word which depends on the first read word and on the processing unit, and at the step of providing each processing unit, for each second read word, with a second message of the second read word, the second message is at a position in the second read word which depends on the second read word and on the processing unit.

According to an embodiment of the present invention, at the step of writing the second words into the first and second single-port memories, each second word contains a second message at a position in the second word which depends on the second word and on the processing unit having provided the second message, and at the step of writing the new first words into the first and second single-port memories, each new first word contains a new first message at a position in the new first word which depends on the new first word and on the processing unit having provided the new first message.

The foregoing and other objects, features, and advantages of the present invention will be discussed in detail in the following non-limiting description of specific embodiments in connection with the accompanying drawings.

DETAILED DESCRIPTION

Figure 1:
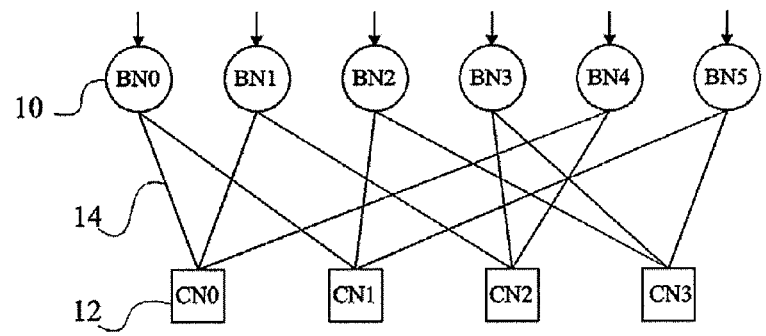
FIG. 1, previously described, shows a graph illustrating an example of an LDPC decoding.

For clarity, the same elements have been designated with same reference numerals in the different drawings.

The present invention comprises replacing the dual-port memory with first and second single-port random access memories (SPRAMs). A first part (for example, half) of the data usually stored in the dual-port memory is stored in the first memory, and the rest (for example, the second half) of the data usually stored in the dual-port memory is stored in the second memory.

In a bit node or check node determination operation, words are read from the first memory and from the second memory. Each read word is transmitted (possibly in modified form) to processing unit 22. Simultaneously, the words successively provided by processing unit 22 are written (possibly in modified form) into the first memory and into the second memory. In more detailed fashion, for reasons of rapidity of execution of the decoding iterations, the read and write operations may be simultaneous. When a word is read from the first memory, a word is then written into the second memory and conversely. The arrangement of the words in the first and second memories is such that, in a bit node or check node determination operation, a word is not written at the location of a word to be used subsequently in the same bit or check node determination step. This can be obtained by taking into account the waiting time necessary for the processing unit to provide new words from the words which are transmitted thereto. Indeed, when words are transmitted to the processing unit, said unit simultaneously provides new words obtained from words which have been previously transmitted thereto.

According to a first advantage of the present invention, the total surface area taken up by the first and second single-port memories is smaller, or even much smaller, than the surface area of dual-port memory 26. Indeed, the first and second memories each comprise the same number of lines equal to half the number of lines of memory 26, a word stored in the first or the second memory having the same number of bits as a word stored in memory 26. For the same amount of stored data, a single-port memory has a surface area much smaller than the surface area of a dual-port memory. The sum of the surface areas of the first and second memories thus is substantially smaller than that of memory 26.

According to a second advantage of the present invention, the duration of a decoding iteration of the decoder according to the present invention is decreased. Indeed, the duration of a write or read operation in a single-port memory containing a determined number of words is smaller than that of a dual-port memory containing twice as many words, by at least 15%. The time required to simultaneously perform a reading from one of the first or second single-port memories and a writing into the other one of the first or second memories is thus shorter than the time required to perform the same simultaneous read and write operations for a dual-port memory.

According to a third advantage of the present invention, the average power of the decoder according to the present invention is reduced. Indeed, with current technologies, the average power consumed by a single-port memory comprising half as many data as a dual-port memory is divided by a factor strictly greater than 2 with respect to the average power consumed by the dual-port memory. The total power consumed by the first and second memories used in the present invention is thus smaller than the power consumed by a dual-port memory.

Figure 2:
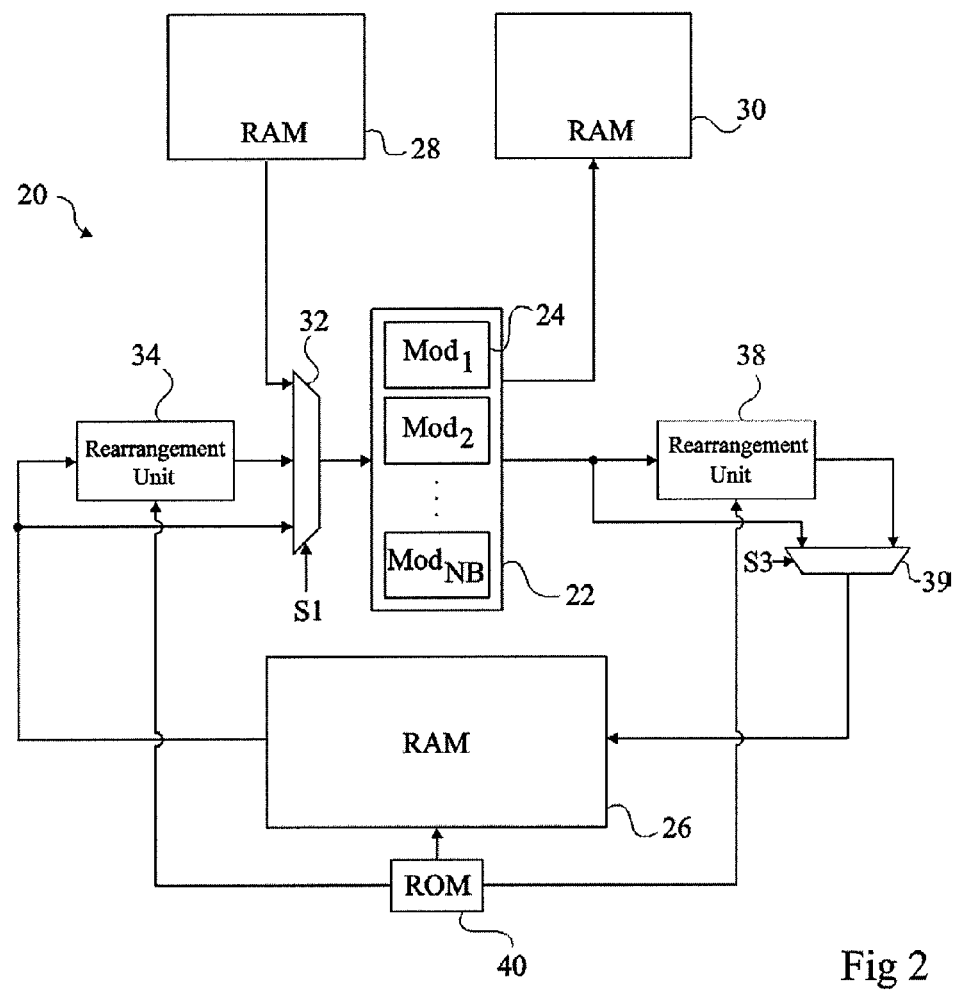
FIG. 2, previously described, schematically shows an example of the forming of a conventional LDPC decoder.
Figure 3:
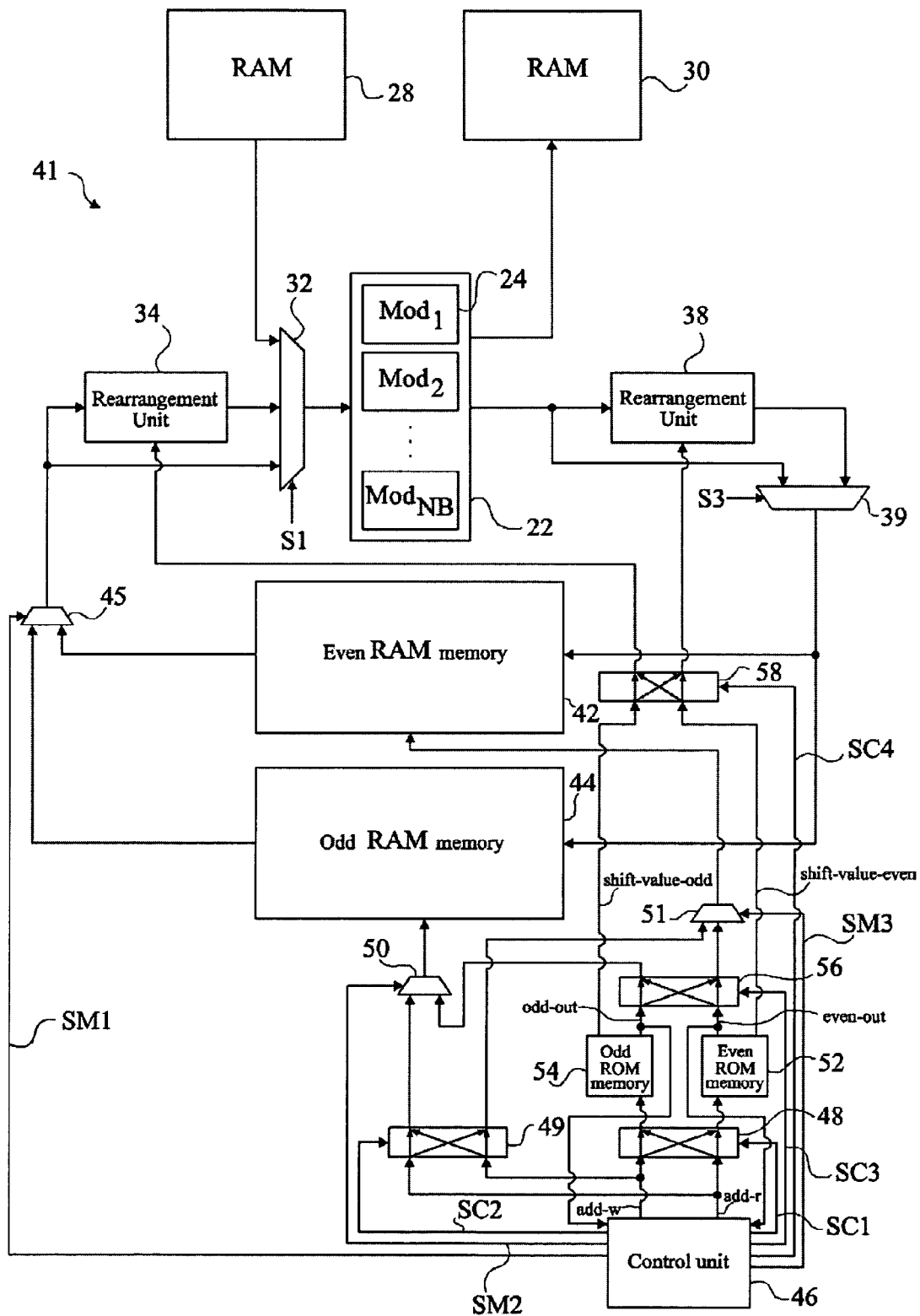
FIG. 3 shows a first example of embodiment of an LDPC decoder according to the present invention.

FIG. 3 shows a first example of embodiment of an LDPC decoder 41 according to the present invention having a general operation similar to that of decoder 20 shown in FIG. 2. Memory 26 is replaced with a first single-port RAM 42, which will be called hereafter the even RAM, and a second single-port RAM 44, which will be called hereafter the odd RAM. Even RAM 42 and odd RAM 44 each contain half as many data as memory 26. Even RAM 42 drives a first input of a multiplexer 45 and odd RAM 44 drives a second input of multiplexer 45. The output of multiplexer 45 is connected to rearrangement unit 34 and to multiplexer 32. A control unit 46 is capable of providing a read address add_r on a first input and a write address add_w on a second input corresponding to access addresses of first and second memories 42, 44. Multiplexer 45 is controlled by a control signal SM1 provided by control unit 46.

Decoder 41 comprises two switches 48, 49 respectively controlled by control signals SC1, SC2 provided by control unit 46 and each receiving, on a first input, read address signal add_r and on a second input, write address signal add_w. Each switch 48, 49 comprises two outputs and is capable of providing on an output one of the address signals and on the other output the other address signal according to the received control signal SC1, SC2.

An output of switch 49 drives a first input of a multiplexer 50, controlled by a signal SM2 provided by control unit 46, and the other output of switch 49 drives a first input of a multiplexer 51, controlled by a signal SM3 provided by control unit 46. An output of switch 48 drives a first memory 52, which will be called hereafter the even ROM. The other output of switch 48 drives a second memory 54, which is called hereafter the odd ROM. Even ROM 52 is capable, on reception of an address add_r or add_w, of providing a signal even_out corresponding to another read or write address in even RAM 42 or in odd RAM 44. Odd ROM 54 is capable, on reception of an address add_r or add_w, of providing a signal odd_out corresponding to another read or write address in odd RAM 44 or in even RAM 42.

Signal even_out drives a first input of a switch 56. Signal odd_out drives a second input of switch 56. Switch 56, controlled by a signal SC3 provided by control unit 46, is capable of providing a first output with one of signals even_out or odd_out and a second output with the other signal even_out or odd_out. The first output of switch 56 drives a second input of multiplexer 50 and the second output of switch 56 drives a second input of multiplexer 51. The output of multiplexer 50 drives odd RAM 44 and the output of multiplexer 51 drives even RAM 42. Simultaneously to the provision of signal even_out, even ROM 52 provides a signal shift_value_even representative of a specific rearrangement operation to be performed at a first input of a switch 58. Simultaneously to the provision of signal odd_out, ROM 54 provides a signal shift_value_odd representative of a specific rearrangement operation to be performed at a second input of switch 58. Switch 58 is controlled by a signal SC4 provided by control unit 46 and is capable of providing, according to control signal SC4, rearrangement unit 34 with one of signals shift_value_even or shift_value_odd and rearrangement unit 38 with the other one of signals shift_value_even or shift_value_odd.

The operation of decoder 41 according to the present invention is the following:
- as an example, it will be assumed that after a bit node determination step, bit node messages are distributed in even RAM 42 and odd RAM 44. At the next check node determination step, the bit node messages are read from even RAM 42 and odd RAM 44 and for each memory, according to a first read order provided by control unit 46. Control unit 46 provides, via switch 49, the read addresses add_r of even RAM 42 and odd RAM 44. As processing unit 22 receives the bit node messages, it provides check node messages which are written into even RAM 42 and odd RAM 44 according to a first read order provided by control unit 46 of access to these memories. Control unit 46 is capable of controlling switches 48, 49, 56, and 58 and multiplexers 50, 51 so that, when the read and write operations are performed simultaneously, it either simultaneously generates a read address in even RAM 42 and a write address in odd RAM 44 or simultaneously a write address in even RAM 42 and a read address in odd RAM 44.

At the next bit node determination step, the check node messages written into even RAM 42 and odd RAM 44 are successively read via rearrangement unit 34 according to a second read order provided by even ROM 52 and odd ROM 54. For this purpose, control unit 46 successively provides read addresses of even RAM 42 and odd RAM 44 according to the regular order of access to the lines of even memory 42 and odd memory 44 to even ROM 52 and odd ROM 54. Even ROM 52 and odd ROM 54 then successively provide new read addresses to even RAM 42 and odd RAM 44 and simultaneously provide shift values shift_value_even and shift_value_odd to rearrangement unit 34 via switch 58. As processing unit 22 receives the check node messages, it provides bit node messages which are successively written into even RAM 42 and odd RAM 44 according to a write order provided by even ROM 52 and odd ROM 54. For this purpose, control unit 46 successively provides write addresses of even RAM 42 and odd RAM 44 according to the regular order of access to the lines of even RAM 42 and odd RAM 44, via switch 48, which drives even ROM 52 and odd ROM 54. Even ROM 52 and odd ROM 54 then successively provide new addresses for the writing into even RAM 42 and odd RAM 44 and simultaneously provide, successively, shift values shift_value_even and shift_value_odd to rearrangement unit 38 via switch 58.

The next successive bit node and check node determination steps develop identically to what has been described here above.

For such a decoder 41, according to the previously-described example, a check node message "exchanged" between check node CNj and bit node BNi, obtained at a check node determination step, is written at the same "location" in one or the other of RAMs 42, 44, as the bit node message "exchanged" between the same bit node BNi and the same check node CNj obtained at a bit node determination step. A rearrangement of the messages of each read and written word should then be performed at a bit node determination step only.

With a different control system, the rearrangement of the messages of each read and written word may be performed only in a check node determination step. Similarly, and independently from the preceding established fact, even ROM 52 and odd ROM 54 may be used to provide the address of even RAM 42 and odd RAM 44 in the check node determination step only.

A more detailed example of the operation of decoder 41 according to the first example of embodiment of the present invention will now be described for the following matrix H:

$$H = \begin{pmatrix} 1 & 0 & 1 & 0 & 1 & 0 & 0 & 0 & 1 & 1 & 1 & 0 \\ 0 & 0 & 1 & 1 & 1 & 0 & 1 & 1 & 0 & 0 & 0 & 1 \\ 1 & 1 & 0 & 0 & 0 & 1 & 1 & 0 & 0 & 0 & 1 & 1 \\ 1 & 0 & 0 & 0 & 1 & 1 & 0 & 1 & 1 & 1 & 0 & 0 \\ 0 & 1 & 1 & 1 & 0 & 0 & 0 & 1 & 0 & 1 & 0 & 1 \\ 0 & 1 & 0 & 1 & 0 & 1 & 1 & 0 & 1 & 0 & 1 & 0 \end{pmatrix} \quad (8)$$

Number Ne of "1"s of matrix H is equal to 36. Matrix H is associated with a graph with 12 bit nodes and with 6 check bit nodes. A (bit or check node) message exchanged between a bit node and a check node is called ek, with k varying from 0 to 35. The numbering of messages ek is performed according to the order of the lines of matrix H and is illustrated by the following matrix H':

$$H' = \begin{pmatrix} e0 & 0 & e1 & 0 & e2 & 0 & 0 & 0 & e3 & e4 & e5 & 0 \\ 0 & 0 & e6 & e7 & e8 & 0 & e9 & e10 & 0 & 0 & 0 & e11 \\ e12 & e13 & 0 & 0 & 0 & e14 & e15 & 0 & 0 & 0 & e16 & e17 \\ e18 & 0 & 0 & 0 & e19 & e20 & 0 & e21 & e22 & e23 & 0 & 0 \\ 0 & e24 & e25 & e26 & 0 & 0 & 0 & e27 & 0 & e28 & 0 & e29 \\ 0 & e30 & 0 & e31 & 0 & e32 & e33 & 0 & e34 & 0 & e35 & 0 \end{pmatrix} \quad (9)$$

In the present example, it is considered that number NB of elementary processing units 24 is equal to 3. For decoder 20 shown in FIG. 2, messages ek, k ranging from 0 to 35, may be stored in memory 26 according to an arrangement corresponding to the following memory MEM:

$$MEM = \begin{bmatrix} e0 & e13 & e25 & | & 0 \\ e1 & e12 & e24 & | & 1 \\ e2 & e14 & e26 & | & 2 \\ e3 & e15 & e27 & | & 3 \\ e4 & e16 & e29 & | & 4 \\ e5 & e17 & e28 & | & 5 \\ e6 & e18 & e30 & | & 6 \\ e7 & e19 & e32 & | & 7 \\ e8 & e20 & e31 & | & 8 \\ e9 & e21 & e34 & | & 9 \\ e10 & e22 & e33 & | & 10 \\ e11 & e23 & e35 & | & 11 \end{bmatrix} \quad (10)$$

where the last column corresponds to the lines of memory 26.

Inversions should be noted between messages e12 and e13, e24 and e25, e28 and e29, e31 and e32, and e33 and e34. Such inversions enable avoiding that messages intended to be used by the same elementary processing unit 24 are in the same word. For example, messages e0 and e12 used in first elementary processing unit Mod$_1$ in a bit node determination step are contained in two different words.

For decoder 41 shown in FIG. 3, messages ek, k ranging from 0 to 35 are, as an example, stored in even RAM 42 and odd RAM 44 according to an arrangement respectively corresponding to the following matrices MEM_EVEN and MEM_ODD:

$$MEM\_EVEN = \begin{pmatrix} e0 & e13 & e25 \\ e2 & e14 & e26 \\ e4 & e16 & e29 \\ e6 & e18 & e30 \\ e8 & e20 & e31 \\ e10 & e22 & e33 \end{pmatrix} \begin{matrix} 0 \\ 1 \\ 2 \\ 3 \\ 4 \\ 5 \end{matrix} \quad (11)$$

$$MEM\_ODD = \begin{pmatrix} e1 & e12 & e24 \\ e3 & e15 & e27 \\ e5 & e17 & e28 \\ e7 & e19 & e32 \\ e9 & e21 & e34 \\ e11 & e23 & e35 \end{pmatrix} \begin{matrix} 0 \\ 1 \\ 2 \\ 3 \\ 4 \\ 5 \end{matrix}$$

the last columns representing the line numbers of even RAM 42 and odd RAM 44. It should be noted that the lines of odd RAM 42 correspond to the even lines of memory 26 and that the lines of odd RAM 44 correspond to the odd lines of memory 26.

As an example, for decoder 20 shown in FIG. 2, address provision unit 40 comprises, at each line, a line number of memory 26 and a number of shift positions. Address provision unit 40 comprises, for example, a memory having a composition corresponding to the following matrix ROM:

$$ROM = \begin{bmatrix} 0 & 0 & | & 0 \\ 1 & 1 & | & 1 \\ 6 & 1 & | & 2 \\ 7 & 0 & | & 3 \\ 2 & 2 & | & 4 \\ 8 & 2 & | & 5 \\ 10 & 2 & | & 6 \\ 9 & 0 & | & 7 \\ 3 & 1 & | & 8 \\ 5 & 2 & | & 9 \\ 4 & 0 & | & 10 \\ 11 & 1 & | & 11 \end{bmatrix} \quad (12)$$

where the first column corresponds to line numbers of memory 26 and the second column corresponds to a number of shift positions, the last column representing the line numbers of the memory.

For the first example of decoder 41 according to the present invention, even ROM 52 and odd ROM 54 have a composition respectively corresponding to the following matrices ROM_EVEN and ROM_ODD:

$$ROM\_EVEN = \begin{pmatrix} 0 & 0 \\ 6 & 1 \\ 2 & 2 \\ 10 & 2 \\ 3 & 1 \\ 4 & 0 \end{pmatrix} \begin{matrix} 0 \\ 1 \\ 2 \\ 3 \\ 4 \\ 5 \end{matrix} \quad ROM\_ODD = \begin{pmatrix} 1 & 1 \\ 7 & 0 \\ 8 & 2 \\ 9 & 0 \\ 5 & 2 \\ 11 & 1 \end{pmatrix} \begin{matrix} 0 \\ 1 \\ 2 \\ 3 \\ 4 \\ 5 \end{matrix} \quad (13)$$

where the last column represents the line numbers of even ROM 52 and odd ROM 54. It should be noted that the lines of even ROM 52 correspond to the even lines of the memory represented by the ROM defined at relation (12) and that the lines of odd ROM 54 correspond to the odd lines of the memory represented by the ROM defined at relation (12).

An example of the progress of a check node determination step is illustrated in the following table I:

TABLE I

| Cycle | add_r | add_w | SC2 | Even RAM address | Odd RAM address | SM1 |
|---|---|---|---|---|---|---|
| 0 | 0 | | 1 | 0R | | |
| 1 | 1 | | 0 | | 0R | 0 |
| 2 | 2 | | 1 | 1R | | 1 |
| 3 | 3 | | 0 | | 1R | 0 |
| 4 | 4 | | 1 | 2R | | 1 |
| 5 | 5 | | 0 | | 2R | 0 |
| 6 | | | | | | |
| 7 | | 5 | 1 | | 2W | |
| 8 | | 4 | 0 | 2W | | |
| 9 | 6 | 3 | 1 | 3R | 1W | 1 |
| 10 | 7 | 2 | 0 | 1W | 3R | 0 |

TABLE I-continued

| Cycle | add_r | add_w | SC2 | Even RAM address | Odd RAM address | SM1 |
|---|---|---|---|---|---|---|
| 11 | 8 | 1 | 1 | 4R | 0W | 1 |
| 12 | 9 | 0 | 0 | 0W | 4R | 0 |
| 13 | 10 |   | 1 | 5R |   | 1 |
| 14 | 11 |   | 0 |   | 5R | 0 |
| 15 |   |   |   |   |   |   |
| 16 |   | 11 | 1 |   | 5W |   |
| 17 |   | 10 | 0 | 5W |   |   |
| 18 |   | 9 | 1 |   | 4W |   |
| 19 |   | 8 | 0 | 4W |   |   |
| 20 |   | 7 | 1 |   | 3W |   |
| 21 |   | 6 | 0 | 3W |   |   |

In table I, the first column represents successive cycles of the clock synchronizing the components of decoder 41. Table I does not take into account the delays in terms of clock cycles of the implementation of the different decoder components. Signals SC2 and SM1 are obtained from signals add_r and add_w. More specifically, signal SC2 is equal to the least significant bit of signal add_w or to the inverse of the least significant bit of signal add_r and signal SM1 is equal to the inverse of the least significant bit of signal add_r. To obtain the line number of even RAM 42 or of odd RAM 44 associated with a signal add_r or a signal add_w, it is enough to remove the least significant bit of signal add_r or of signal add_w. At the fifth and sixth columns of table I, letter "R" means that a read operation is performed in the considered RAM and letter "W" means that a write operation is performed in the considered memory. Switch 49 provides signal add_r to multiplexer 51 and signal add_w to multiplexer 50 when control signal SC2 is at "1", and provides signal add_r to multiplexer 50 and signal add_w to multiplexer 51 when control signal SC2 is at "0". All along the check node determination step, control signals SM2 and SM3 are constant and selected so that multiplexers 50, 51 respectively provide even RAM 42 and odd RAM 44 with signals add_r or add_w from switch 49. The value of signal SC4 here has no object since rearrangement units 34, 38 are not used in the check node determination step.

In the check node determination step, for each word read from even RAM 42 or from odd RAM 44, the message at the first position is used by first elementary unit $Mod_1$, the message at the second position is used by second elementary unit $Mod_2$, and the message at the third position is used by third elementary unit $Mod_3$. As an example, at cycles 0 to 5, first elementary unit $Mod_1$ successively receives bit node messages e0 to e5 from which it determines check node messages e0 to e5 respectively stored at the same location as the preceding messages e0 and e5 in even RAM 42 or odd RAM 44. It should be noted, in the present example, that if bit node messages e0 to e5 are successively read, elementary processing unit $Mod_1$ provides the check node messages in the inverse order, that is, e5, e4, e3, e2, e1, then e0 are successively written. The distribution of messages ei, i ranging from 0 to 35, in even RAM 42 or odd RAM 44 thus respectively corresponds again to matrices MEM_EVEN and MEM_ODD defined at relation (11).

In a bit node determination step, rearrangement units 34, 38 use the information provided by even ROM 52 and odd ROM 54 to read and write the right messages at the right locations.

An example of the progress of a bit node determination step is illustrated in the following table II:

TABLE II

| Cycle | add_r | add_w | SC1 | even ROM line | odd ROM line | even_out | odd_out | SC3 | even RAM address | odd RAM address | SM1 | SC4 | Shift_value (read) | Shift_value (write) |
|---|---|---|---|---|---|---|---|---|---|---|---|---|---|---|
| 0 | 0 |   | 1 | 0 |   | 0 |   | 0 | 0R |   | 1 | 0 | 0 |   |
| 1 | 1 |   | 0 |   | 0 |   | 1 | 0 |   | 0R | 0 | 1 | 1 |   |
| 2 | 2 |   | 1 | 1 |   | 6 |   | 0 | 3R |   | 1 | 0 | 1 |   |
| 3 |   |   |   |   |   |   |   |   |   |   |   |   |   |   |
| 4 |   | 2 | 0 | 1 |   | 6 |   | 0 | 3W |   |   | 1 |   | 1 |
| 5 | 4 | 1 | 1 | 2 | 0 | 2 | 1 | 0 | 1R | 0W | 1 | 0 | 2 | 1 |
| 6 | 3 | 0 | 0 | 0 | 1 | 0 | 7 | 0 | 0W | 3R | 0 | 1 | 0 | 0 |
| 7 | 5 |   | 0 |   | 2 |   | 8 | 1 | 4R |   | 1 | 1 | 2 |   |
| 8 |   |   |   |   |   |   |   |   |   |   |   |   |   |   |
| 9 |   | 5 | 1 |   | 2 |   | 8 | 1 | 4W |   |   | 0 |   | 2 |
| 10 | 6 | 3 | 1 | 3 | 1 | 10 | 7 | 0 | 5R | 3W | 1 | 0 | 2 | 0 |
| 11 | 7 | 4 | 0 | 2 | 3 | 2 | 9 | 0 | 1W | 4R | 0 | 1 | 0 | 2 |
| 12 | 8 |   | 1 | 4 |   | 3 |   | 1 |   | 1R | 0 | 0 | 1 |   |
| 13 |   |   |   |   |   |   |   |   |   |   |   |   |   |   |
| 14 |   | 8 | 0 | 4 |   | 3 |   | 1 |   | 1W | 1 |   |   | 1 |
| 15 | 10 | 7 | 1 | 5 | 3 | 4 | 9 | 0 | 2R | 4W | 1 | 0 | 0 | 0 |
| 16 | 9 | 6 | 0 | 3 | 4 | 10 | 5 | 0 | 5W | 2R | 0 | 1 | 2 | 2 |
| 17 | 11 |   | 0 |   | 5 |   | 11 | 0 |   | 5R | 0 | 1 | 1 |   |
| 18 |   |   |   |   |   |   |   |   |   |   |   |   |   |   |
| 19 |   | 11 | 1 |   | 5 |   | 11 | 0 | 5W |   |   | 0 |   | 1 |
| 20 |   | 9 | 1 |   | 4 |   | 5 | 0 |   | 2W |   | 0 |   | 2 |
| 21 |   | 10 | 0 | 5 |   | 4 |   | 0 | 2W |   |   | 1 |   | 0 |

In table II, the same conventions as those used for table I are used, except that signal SM1 is equal to the inverse of the least significant bit of signal even_out or odd_out when said bit is associated with a read operation. Further, signal SC1 is equal to the least significant bit of signal add_w or to the inverse of the least significant bit of signal add_r, signal SC3 is equal to the least significant bit of signal even_out or to the inverse of the least significant bit of signal odd_out, and signal SC4 is equal to the least significant bit of signal add_r or to the inverse of the least significant bit of signal add_w. To obtain the line number of even or odd ROM 52, 54 corresponding to a signal add_r or a signal add_w, it is enough to remove the least significant bit of signal add_r or of signal add_w. Similarly, to obtain the line number of even RAM 42 or odd RAM 44 corresponding to a signal odd_out or to a signal even_out, it is enough to remove the least significant bit of signal odd_out or of signal even_out.

Switch 48 provides signal add_r to even ROM 52 and signal add_w to odd ROM 54 when control signal SC1 is at "1" and provides signal add_r to odd ROM 54 and signal add_w to odd ROM 52 when control signal SC1 is at "0". Switch 56 provides signal even_out to multiplexer 51 and signal odd_out to multiplexer 50 when control signal SC3 is at "0" and provides signal even_out to multiplexer 50 and signal odd_out to multiplexer 51 when control signal SC3 is at "1". Switch 58 provides signal shift_value_even to rearrangement unit 38 and signal shift_value_odd to rearrangement unit 34 when control signal SC4 is at "1" and provides shift_value_even to rearrangement unit 34 and signal shift_value_odd to rearrangement unit 38 when control signal SC4 is at "0".

In the bit node determination step, the words are read from even RAM 42 or from odd RAM 44 in the order indicated by even ROM 52 and odd ROM 54. As an example, the determination of the bit nodes of index 0, 1, and 2 is obtained from line no°0 of even ROM 52 which returns line number 0 used to read from even memory 42, of line no°0 of odd ROM 54 which returns line number 1 used to read from odd memory 44, and of line no°1 of even ROM 52 which returns line number 6 used to read from even memory 42.

Rearrangement unit 34 thus receives the word stored at line no°0 of even RAM 42 and performs a leftward shift of the messages of the read word by a number 0 of shift positions and provides message e0, at the first position of the modified word, to first elementary processing unit $Mod_1$, message e13, at the second position, to second elementary processing unit $Mod_2$, and message e25, at the third position, to third elementary processing unit $Mod_3$. Rearrangement unit 34 then receives the word stored at line no°0 of odd RAM 44, performs a leftward shift of the messages of the read word by 1 shift position and thus provides message e12, at the first position of the modified word, to first elementary processing unit $Mod_1$, message e24, at the second position, to second elementary processing unit $Mod_2$ and message e1, at the third position, to third elementary processing unit $Mod_3$. Finally, rearrangement unit 34 then receives the word stored at line no°3 of even RAM 42 and performs a leftward shift of the messages of the read word by 1 shift position and thus provides message e18, at the first position of the modified word, to first elementary processing unit $Mod_1$, message e30, at the second position, to second elementary processing unit $Mod_2$, and message e6, at the third position, to third elementary processing unit $Mod_3$.

At the end of the determination of bit nodes no°0, 1, and 2, rearrangement unit 38 successively receives the next three words (e18, e30, e6), (e12, e24, e1) and (e0, e13, e25). To properly write the word (e18, e30, e6), rearrangement unit 38 uses, at cycle 4, the rearrangement data stored at line no°1 of even ROM 52 which indicates a number 1 of shift positions. Rearrangement unit 38 then provides a new word (e6, e18, e30) corresponding to the initial word circularly shifted to the right by one shift position. Line no°1 of even ROM 52 sends back to line number no°6. Rearrangement unit 38 thus writes the new word (e6, e18, e30) at line no°3 of even RAM 42. The distribution of messages ei, i ranging from 0 to 35, into RAMs 42, 44 thus corresponds, at the end of the bit node determination step, again to matrices MEM_EVEN and MEM_ODD defined at relation (11).

Figure 4:
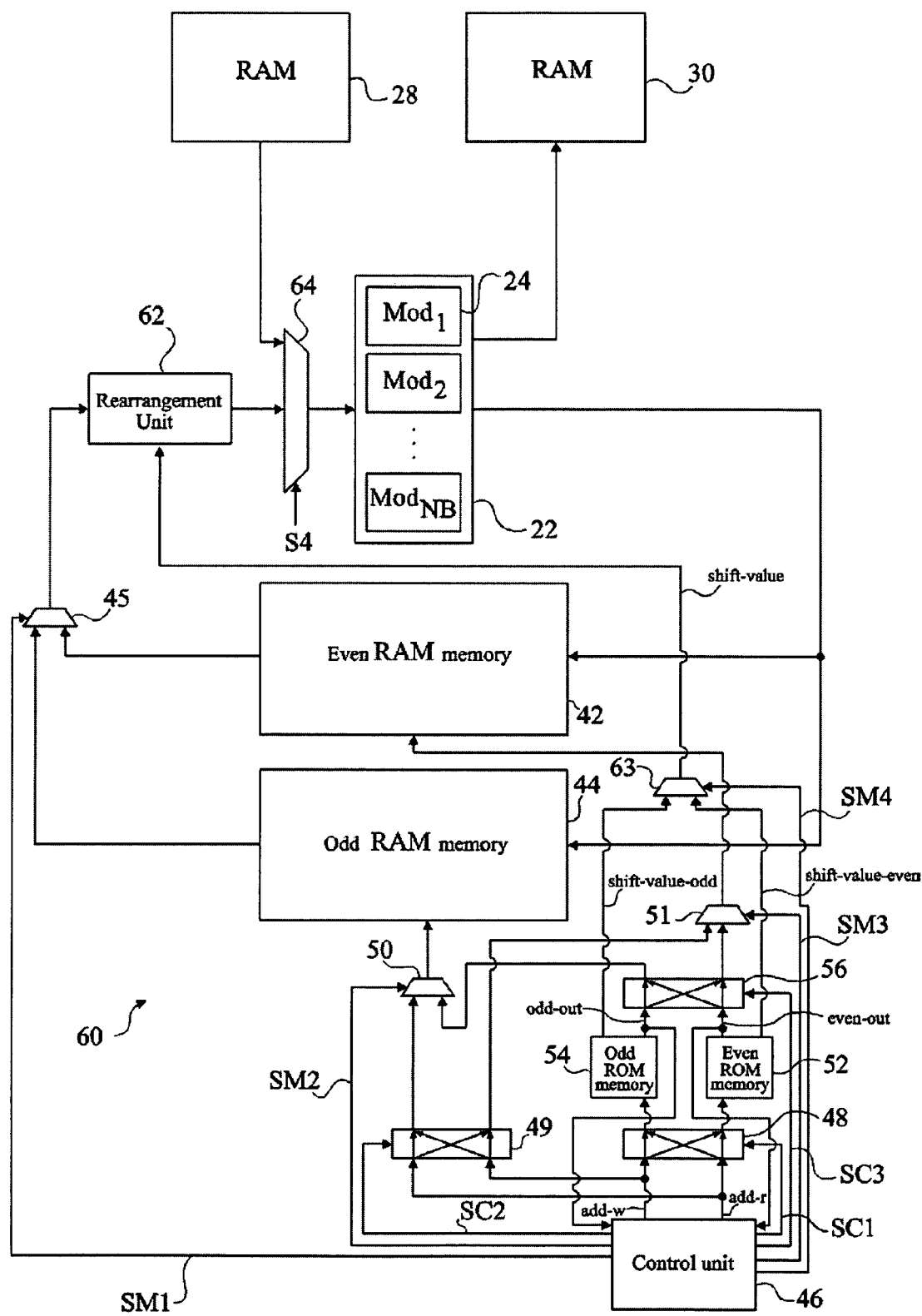
FIG. 4 shows a second example of embodiment of an LDPC decoder according to the present invention.

FIG. 4 shows a second example of embodiment of a decoder 60 according to the present invention. Conversely to decoder 41 shown in FIG. 3, decoder 60 comprises a single rearrangement unit 62 capable of reading words from even RAM 42 or odd RAM 44, possibly according to an order different from the regular order of access to the lines of even RAM 42 or odd RAM 44, and of performing a rearrangement of the messages forming the read word. Signal shift_value_even, provided by even ROM 52, arrives onto a first input of a multiplexer 63, controlled by a control signal SM4 provided by control unit 46, and signal shift_value_odd, provided by odd ROM 54, arrives onto a second input of multiplexer 63. Multiplexer 63 provides a signal shift_value to rearrangement unit 62 indicating how the messages of the read word are to be rearranged.

A multiplexer 64, controlled by a signal S4, is connected at a first input to rearrangement unit 62 and at a second input to input memory 28. According to the value of signal S4, multiplexer 64 successively provides processing unit 22 with words stored in input memory 28 or words provided by rearrangement unit 62. Processing unit 22 is connected at a first output to even RAM 42 and to odd RAM 44 and at a second input to output memory 30. Conversely to decoder 41 shown in FIG. 3, signal shift_value is transmitted to rearrangement unit 62 only.

For decoder 60, a check node message "exchanged" between check node CNj and bit node BNi, obtained at a check node determination step, is not written at the same "location" in one or the other of RAMs 42, 44 as the bit node message "exchanged" between the same bit node BNi and the same check node CNj obtained at a bit node determination step. A rearrangement of the messages of each read and written word should then be performed on reading of the words from one or the other of RAMs 42, 44 both in a bit node determination step and in a check node determination step.

As an example, the rearrangement operation performed by rearrangement unit 62 is a read word shift operation. According to this example, in the check node determination step, rearrangement unit 62 provides messages to processing unit 22 by reading the words from even RAM 42 and odd RAM 44 by performing, on each read word, a rightward shift by a number of shift positions indicated in even ROM 52 and odd ROM 54.

In the next bit node determination step, rearrangement unit 62 provides messages to processing unit 22 by reading the words from even RAM 42 and odd RAM 44 by performing, on each read word, a leftward shift by a number of shift positions indicated in even ROM 52 and odd ROM 54.

After a bit or check node determination step, the new obtained words provided by processing unit 22 are written into even RAM 42 and odd RAM 44 without performing any shift.

According to the present example, the number of rightward or leftward shift positions are stored in ROMs 52, 54. Since rearrangement unit 62 performs a circular shift on the read words, a number of rightward shift positions may be stored in ROMs 52, 54 in the form of an equivalent number of leftward shift positions. This enables using a rearrangement unit 62 only performing leftward shifts.

A more detailed example of the operation of decoder 60 according to the second example of embodiment according to the present invention will now be described for matrix H defined at relation (9) and assuming that even ROM 52 and odd ROM 54 respectively correspond to matrices ROM_EVEN and ROM_ODD defined at relation (13).

It is assumed that at the beginning of a bit node determination step, the message distribution in even RAM 42 and odd RAM 44 respectively corresponds to matrices MEM_EVEN and MEM_ODD defined at relation (11).

At the next bit node determination step, rearrangement unit 62 provides messages to processing unit 22 by reading the words from even RAM 42 or from odd RAM 44 in the order indicated by even and odd ROMs 52, 54 and by performing, for each read word, a leftward shift by the number of shift positions indicated by even and odd ROMs 52, 54 as described in relation with the first example of embodiment. As an example, rearrangement unit 62 successively provides the three words (e0, e13, e25), (e12, e24, e1), and (e18, e30, e6) to processing unit 22.

The new obtained words provided by processing unit 22 are then written into even RAM 42 or into odd RAM 44 by following the order indicated by even or odd ROMs 52, 54 but without performing any shift. As an example, processing unit 22 successively provides three new words (e0, e13, e25), (e12, e24, e1), and (e18, e30, e6) which are respectively written at line no°0 of even RAM 42, at line no°0 of odd RAM 44, and at line no°3 of even RAM 42.

An arrangement of the messages in RAMs 42 and 44 which corresponds to the following matrices MEM_EVEN and MEM_ODD is thus obtained:

$$\text{MEM\_EVEN} = \begin{pmatrix} e0 & e13 & e25 \\ e26 & e2 & e14 \\ e4 & e16 & e29 \\ e18 & e30 & e6 \\ e31 & e8 & e20 \\ e33 & e10 & e22 \end{pmatrix} \begin{matrix} 0 \\ 1 \\ 2 \\ 3 \\ 4 \\ 5 \end{matrix} \quad (14)$$

$$\text{MEM\_ODD} = \begin{pmatrix} e12 & e24 & e1 \\ e15 & e27 & e3 \\ e28 & e5 & e17 \\ e7 & e19 & e32 \\ e9 & e21 & e34 \\ e23 & e35 & e11 \end{pmatrix} \begin{matrix} 0 \\ 1 \\ 2 \\ 3 \\ 4 \\ 5 \end{matrix}$$

The bit determination step may substantially be carried out according to the same sequence as that indicated in previously-described table II. However, the columns entitled "SC4" and "Shift_value (write)" are not to be taken into account since no shift is performed on the words written into even RAM 42 or into odd RAM 44.

In the next check node determination step, rearrangement unit 62 successively reads words from even and odd RAMs 42, 44 according to a regular read order and performs, for a word read from even RAM 42 or from odd RAM 44 at a determined line number, a circular shift to the right, by the number of shift positions indicated at the same line number of one of ROMs 52, 54. The new words provided by processing unit 22 are then written into even RAM 42 or into odd RAM 44 in the normal order of the lines of these memories with no shift. An arrangement of the messages in even and odd RAMs 42, 44 corresponding to matrices MEM_EVEN and MEM_ODD defined at relation (11) is then found again. The check node determination step may be performed according to the same sequence as that indicated in Table I by however providing that a shift operation is to be performed on each read word.

The arrangement of the messages in even and odd RAMs 42, 44 is thus different after a check node determination step and after a bit node determination step.

Figure 5:
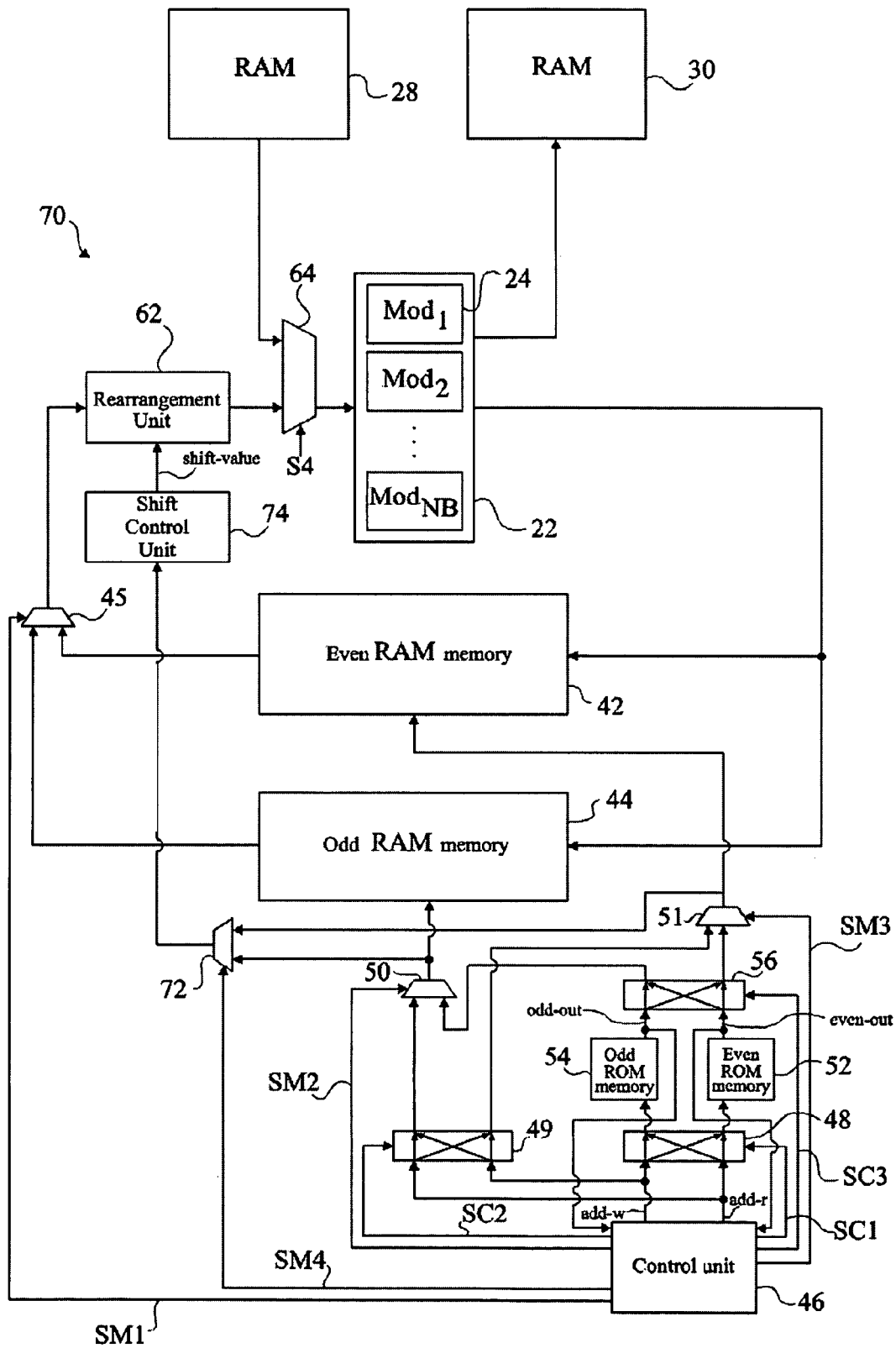
FIG. 5 shows a third example of embodiment of an LDPC decoder according to the present invention.

FIG. 5 shows a third example of embodiment of a decoder 70 according to the present invention.

Conversely to decoder 60 shown in FIG. 4, the output of multiplexer 50 is, further, connected to a first input of a multiplexer 72 and the output of multiplexer 51 is, further, connected to a second input of a multiplexer 72. Multiplexer 72 is controlled by a signal SM4 provided by control unit 46. Multiplexer 72 thus provides one of the following signals add_r, add_w, even_out, and odd_out to a shift control unit 74 which provides, for each signal representative of a received address, a shift value shift_value to rearrangement unit 62. Only data representative of addresses of RAMs 42, 44 are then stored in even and odd ROMs 52, 54. The operation of decoder 70 is further identical to the operation of decoder 60.

Figure 6:
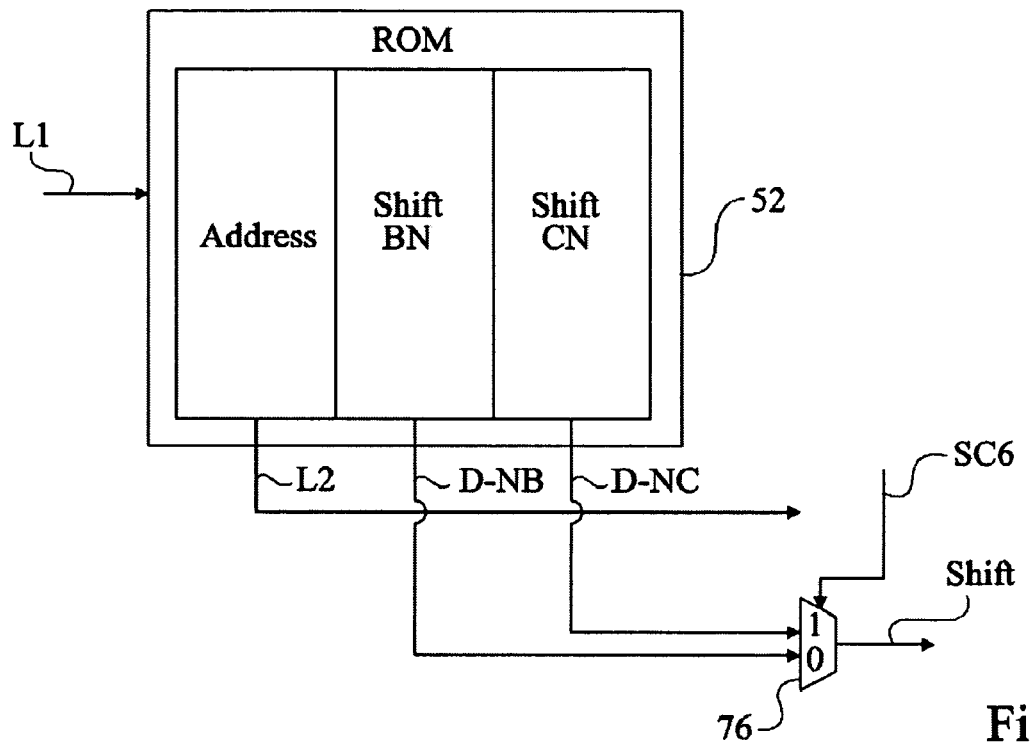
FIG. 6 shows in further detail elements of the decoder of FIG. 4.

FIG. 6 shows a more detailed example of the forming of one of even or odd ROMs 52 or 54 of the second example of embodiment of the present invention. ROM 52, 54 is capable of receiving a signal L1 equal to add_r or to add_w and which is representative of an initial line number of the associated RAM 42, 44 and of providing a signal L2 (even_out or odd_out) representative of a new line number of RAM 42, 44, a signal D_NB representative of a number of shift positions to be used in a bit node determination step, and a signal D_NC representative of a number of shift positions to be used in a check node determination step. The decoder comprises a multiplexer 76, controlled by a binary control signal SC6 provided by control unit 46, receiving signal D_NB at a first input and signal D_NC at a second input and providing a signal Decal age, corresponding to the signal shift_value_odd or shift_value_even transmitted to rearrangement unit 62 for the second example of embodiment. As an example, when signal SC6 is high, which indicates that a check node determination step is going on, signal Decal age is equal to D_NC and when signal SC6 is low, which indicates that a bit node determination step is going on, signal Decal age is equal to D_NB.

Figure 7:
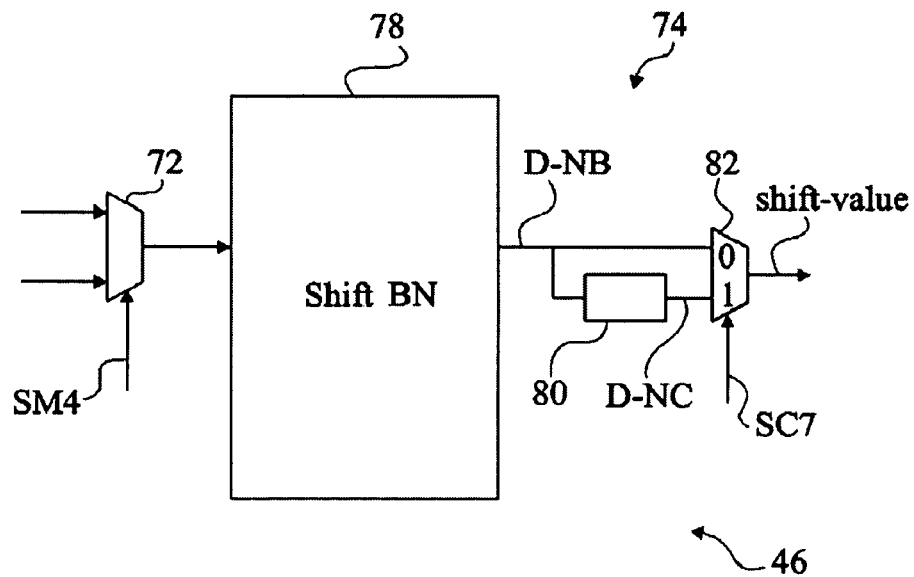
FIG. 7 shows in further detail elements of the decoder of FIG. 5.

FIG. 7 shows a more detailed example of the forming of shift control unit 74 for the third example of embodiment of decoder 70 according to the present invention. Each ROM 52, 54 of decoder 70 according to the third example of embodiment only provides an address signal even_out, odd_out. Multiplexer 72 provides shift control unit 74 with a signal representative of an address of one of even or odd RAMs 42, 44 and which may correspond to one of signals add_r, even_out, or odd_out. Shift control unit 74 comprises a memory 78 capable of receiving the signal representative of an address and of providing the number of shift positions D_NB adapted to the carrying out of a bit node determination step. Shift control unit 74 comprises a unit 80 capable of determining the number of shifts D_NC to be used in a check node determination step based on D_NB. A multiplexer 82, controlled by signal SC7, receives signal D_NB at a first input and signal D_NC at a second input and provides signal shift_value to rearrangement unit 62. As an example, when signal SC7 is high, which indicates that a check node determination step is going on, signal shift_value is equal to D_NC and when signal SC7 is low, which indicates that a bit node determination step is going on, signal shift_value is equal to D_NB.

For the second and third examples of embodiment of the decoder according to the present invention, decoder 60, 70 comprises but a single rearrangement unit 62. Since the surface area necessary to the forming of shift control unit 74 is negligible, the surface area taken up by a rearrangement unit is practically completely freed with respect to decoder 41. Further, rearrangement unit 62 of decoder 60, 70 according to the second or the third example of embodiment may have a structure identical to that of a conventional rearrangement unit 34, 38.

According to a variation of the second and third examples of embodiment, rearrangement unit 62 is placed between processing unit 22 and RAMs 42, 44 downstream of processing unit 22 according to the data flow direction. Rearrangement unit 62 is then capable of writing a word into RAMs 42, 44 based on a word provided by processing unit 22 by modifying the position of the messages in the word provided by processing unit 22. In a bit node determination step or a check node determination step, the message at the first position of each read word is provided to first elementary processing unit $Mod_1$, the message at the second position of each read word is provided to second elementary processing unit $Mod_2$, etc., and the message at the last position of each read word is provided to the last elementary processing unit $Mod_{NB}$. Rearrangement unit 62 then modifies the message position in each word provided by processing unit 22 so that all messages to be provided to a same elementary processing unit $Mod_i$, i ranging from 1 to NB, at the next determination step are at the same position in each word. A different distribution of the bit node messages and of the check node messages is then obtained in RAMs 42, 44, respectively after a bit node determination step or a check node determination step.

Of course, the present invention is likely to have various alterations, modifications, and improvements which will readily occur to those skilled in the art. In particular, the rearrangement unit may perform an operation other than a shift. It may for example perform permutations.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An LDPC decoder that receives input words and provides output words to an output memory, the output words representing a decoding of the input words, the decoder comprising:
   a determined number of processing units operating in parallel, capable of receiving first messages and of providing second messages based on a processing of the first received messages;
   first and second single-port memories;
   first means for:
      reading first words both from the first single-port memory and from the second single-port memory, each first word comprising a juxtaposition of first messages in a number equal to said determined number;
      providing first messages to the processing units, each first message being based on at least one of the first words and/or at least one of the input words;
      forming second words, each second word comprising a juxtaposition of second messages provided by the processing units in a number equal to said determined number; and
      writing at least some of the second words into the first and second single-port memories, said first means being capable, for at least some of the first words and second words, of reading the at least some of the first words from the first single-port memory and of simultaneously writing the at least some of the second words into the second single-port memory or of reading the at least some of the first words from the second single-port memory and of simultaneously writing the at least some of the second words into the first single-port memory; and
   second means for providing the output words based, at least in part, on the second messages provided by the processing units.

2. The LDPC decoder of claim 1, wherein the processing units are capable of receiving third messages and of providing fourth messages based on a processing of the third messages, the processing of the third messages being different from the processing of the first messages, said decoder further comprising third means for:
   reading at least some of the second words both from the first single-port memory and from the second single-port memory;
   providing third messages to the processing units, each third message being based on at least one of the second words;
   forming third words from the fourth messages provided by the processing units; and
   writing at least some of the third words into the first and second single-port memories said third means being capable for at least some of the second words and third words, of reading the at least some of the second words from the first single-port memory and simultaneously writing the at least some of the third words into the second single-port memory or of reading the at least some of the second words from the second single-port memory and simultaneously writing the at least some of the third words into the first single-port memory.

3. The decoder of claim 2, comprising:
   a first rearrangement unit capable of providing each processing unit, for each first word, with a first message at a position in the first word which depends on the first word and on the processing unit; and
   a second rearrangement unit for forming the second words, the position of a second message in the second word depending on the second word and on the processing unit having provided the second message.

4. The decoder of claim 2 comprising a rearrangement unit capable of providing each processing unit, for each first word, with a first message at a position in the first word which depends on the first word and on the processing unit, and capable of providing each processing unit, for each one of the at least some of the second words, with a third message at a position in the one of the at least some of the second words which depends on the one of the at least some of the second words and on the processing unit.

5. The decoder of claim 2, comprising a rearrangement unit capable of forming the second words, the position of a second message in a second word depending on the second word and on the processing unit having provided the second message, and capable of forming the third words the position of a fourth message in a third word depending on the third word and on the processing unit having provided the fourth message.

6. An iterative LDPC decoding method for receiving input words and providing output words that represent a decoding of the input words, said method using a determined number of processing units operating in parallel, said method comprising:

providing each processing unit with a first message based on at least one of the input words;

reading first words both from a first single-port memory and from a second single-port memory, each first word comprising a juxtaposition of first messages in a number equal to the determined number;

providing each processing unit, for each first word, with a first message based on the first word;

providing, from each processing unit, second messages based on a processing of the first messages;

writing at least some of the second words into the first and second single-port memories, each second word corresponding to a juxtaposition of second messages in a number equal to the determined number, for at least some of the first words and second words, the reading of the at least some of the first words from the first memory being performed simultaneously with the writing of the at least some of the second words into the second memory or the reading of the at least some of the first word from the second memory being performed simultaneously with the writing of the at least some of the second word into the first memory; and providing the output words based, at least in part. on the second messages provided by the processing units.

7. The method of claim 6, further comprising:

reading at least some of the second words both from the first single-port memory and from the second single-port memory;

providing each processing unit, for each one of the at least some of the second words, with a third message based on the one of the at least some of the second words;

having each processing unit provide fourth messages based on a processing of the third messages, the processing of the third messages being different from the processing of the first messages; and writing into the first and second memories third words obtained from the first fourth messages, for at least some of the second words and third words, the reading of the at least some of the second words from the first memory being performed simultaneously with the writing of the at least some of the third words into the second memory or the reading of the at least some of the second word words from the second memory being performed simultaneously with the writing of the at least some of the third words into the first memory.

8. The method of claim 7, wherein the order of the reading of the first words from the first and second single-port memories is different from the order of the reading of the at least some of the second words from the first and second single-port memories.

9. The method of claim 7, wherein at the step of providing each processing unit, for each first word, with a first message based on the first word, the first message is at a position in the first word which depends on the first word and on the processing unit, and at the step of writing at least some of the second words into the first and second single-port memories, each one of the at least some of the second words contains a second message at a position in the one of the at least some of the second words which depends on the one of the at least some of the second words and on the processing unit having provided the second message.

10. The method of claim 7, wherein at the step of providing each processing unit, for each first word, with a first message based on the first word, the first message is at a position in the first word which depends on the first word and on the processing unit, and at the step of providing each processing unit, for each one of the at least some of the second words, with a third message based on the one of the at least some of the second words, the third message is at a position in the one of the at least some of the second words which depends on the one of the at least some of the second words and on the processing unit.

11. The method of claim 7, wherein at the step of writing at least some of the second words into the first and second single-port memories, each one of the at least some of the second words contains a second message at a position in the one of the at least some of the second words which depends on the one of the at least some of the second words and on the processing unit having provided the second message, and at the step of writing the third words into the first and second single-port memories, each third word contains a fourth message at a position in the third word which depends on the third word and on the processing unit having provided the fourth message.

12. A method for implementing a low density parity check (LDPC) decoder using N processing units operating in parallel, the method comprising:

receiving a set of input words comprising a first input word;

forming N first input messages, based at least in part on a first processing of the first input word;

providing the N first input messages to the N processing units to obtain N first output messages;

forming a first output word, based at least in part on the N first output messages;

writing the first output word into a first single-port memory and simultaneously reading a second input word from a second single-port memory;

forming a second output word based at least in part on N second output messages provided by the N processing units; and providing a set of output words comprising the second output word, wherein the set of output words forms a decoding of the set of input words.

13. The method of claim 12, further comprising:

forming N second input messages, based at least in part on a second processing of the second input word; and providing the N second input messages to the N processing units.

14. The method of claim 13, wherein the second input word comprises the N second input messages in a first ordering, and the N second input messages are provided to the N processing units in a second ordering that is different from the first ordering.

15. The method of claim 12, further comprising:

forming a third output word based at least in part on N third output messages provided by the N processing units; and writing the third output word into the second single-port memory and simultaneously reading a third input word from the first single-port memory.

16. The method of claim 12, further comprising:

forming N third input messages, based at least in part on a third processing of the third input word; and providing the N third input messages to the N processing units.

17. The method of claim 16, wherein the third input word comprises the N third input messages in a first ordering, and the N third input messages are provided to the N processing units in a second ordering that is different from the first ordering.

18. The method of claim 12, wherein the N first output messages are provided by the N processing units in a first ordering, and the first output word comprises the N first output messages in a second ordering that is different from the first ordering.

19. The method of claim 12, wherein the N second output messages are provided by the N processing units in a first ordering, and the second output word comprises the N second output messages in an second ordering that is different from the first ordering.

20. The method of claim 12, further comprising:
converting an address signal from a control unit to a first address of the first single port memory or to a second address of the second single port memory.

* * * * *

UNITED STATES PATENT AND TRADEMARK OFFICE
CERTIFICATE OF CORRECTION

PATENT NO. : 7,454,693 B2
APPLICATION NO. : 11/158718
DATED : November 18, 2008
INVENTOR(S) : Pascal Urard et al.

It is certified that error appears in the above-identified patent and that said Letters Patent is hereby corrected as shown below:

Col. 1, line 44, should read:
represents a bit node. As an example, six bit nodes BNi, with $$w_{j \to i} = \ln\left(\frac{1 + \prod_{k \in S1j, k \neq i} \tanh(v_{k \to j}/2)}{1 - \prod_{k \in S1j, k \neq i} \tanh(v_{k \to j}/2)}\right) \quad (5)$$

$$v_{i \to j} = LLR(y_i) + \sum_{k \in S2i, k \neq j} w_{k \to i} \quad (6)$$

$$L_i = LLR(y_i) + \sum_{k \in S2i} w_{k \to i} \quad (7)$$

Col. 7, line 58, should read:
the same reference numerals in the different drawings.

Col. 10, lines 26-27, should read:
steps develop identically to what has been described hereabove.

Col. 18, line 32, 36 and 38 should read:
a signal Decalage, corresponding to the signal shift_value_odd
   line 36 should read:
mination step is going on, signal Decalage is equal to D_NC
   line 38 should read:
determination step is going on, signal Decalage is equal to Claim 7, col. 21, line 37, should read:
obtained from the fourth messages, for at least some

UNITED STATES PATENT AND TRADEMARK OFFICE
CERTIFICATE OF CORRECTION

PATENT NO. : 7,454,693 B2
APPLICATION NO. : 11/158718
DATED : November 18, 2008
INVENTOR(S) : Pascal Urard et al.

It is certified that error appears in the above-identified patent and that said Letters Patent is hereby corrected as shown below:

lines 42-43 should read:
or the reading of the at least some of the second words from the second memory being performed simul- Signed and Sealed this Twenty-seventh Day of January, 2009

JOHN DOLL
*Acting Director of the United States Patent and Trademark Office*